Figure 1:
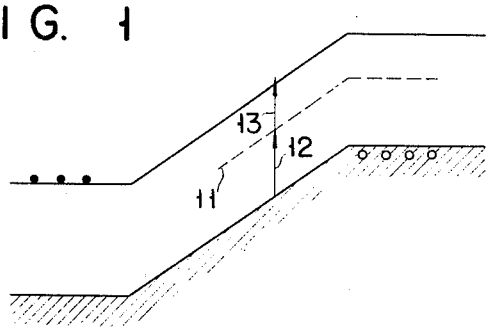

United States Patent [19]
Naito et al.

[11] 3,951,699
[45] Apr. 20, 1976

[54] METHOD OF MANUFACTURING A GALLIUM PHOSPHIDE RED-EMITTING DEVICE

[75] Inventors: Makoto Naito, Kamakura; Akinobu Kasami, Yokohama; Masaru Kawachi; Tetsuo Sadamasa, both of Tokyo; Hiroki Mineo, Yokohama, all of Japan

[73] Assignee: Tokyo Shibaura Electric Co., Ltd., Kawasaki, Japan

[22] Filed: Feb. 6, 1974

[21] Appl. No.: 440,020

[30] Foreign Application Priority Data
Feb. 22, 1973   Japan................................. 48-20687
Feb. 22, 1973   Japan................................. 48-20688

[52] U.S. Cl.................................. 148/171; 148/172
[51] Int. Cl.²................................. H01L 7/00
[58] Field of Search............. 148/171, 172, 1.5, 1.6, 148/175; 117/201; 313/499; 357/16, 17, 63

[56] References Cited
UNITED STATES PATENTS

| | | | |
|---|---|---|---|
| 3,278,342 | 10/1966 | John et al............................. | 148/1.6 |
| 3,540,941 | 11/1970 | Lorenz et al......................... | 148/171 |
| 3,584,267 | 6/1971 | Logan et al.......................... | 148/171 |
| 3,603,833 | 9/1971 | Logan.................................. | 148/171 |
| 3,611,069 | 10/1971 | Fenner et al........................ | 148/171 |
| 3,646,406 | 2/1972 | Logan et al.......................... | 148/171 |
| 3,703,671 | 11/1972 | Saul..................................... | 317/235 R |
| 3,752,713 | 8/1973 | Sakuta et al......................... | 357/17 |
| 3,806,774 | 4/1974 | Hartman et al..................... | 357/17 |

*Primary Examiner*—Walter R. Satterfield
*Attorney, Agent, or Firm*—Oblon, Fisher, Spivak, McClelland & Maier

[57] ABSTRACT

A method of manufacturing a gallium phosphide (GaP) red-emitting device by forming at least one n-type GaP layer on an n-type GaP substrate by the liquid phase epitaxial growth process and further depositing a p-type GaP layer on said n-type GaP layer, thereby providing a p-n junction contributing to emission of light, characterized in that the method comprises reducing the surface donor concentration of the n-type GaP layer to below $1 \times 10^{18}$ cm$^{-3}$; and epitaxially growing at least the light emitting region of the p-type GaP layer by cooling a solution for epitaxial growth of said p-type GaP layer at a slower rate than 5°C per minute.

4 Claims, 7 Drawing Figures

METHOD OF MANUFACTURING A GALLIUM PHOSPHIDE RED-EMITTING DEVICE

This invention relates to a method of manufacturing a red light-emitting gallium phosphide (GaP) device capable of efficiently emitting light.

It is known that the luminescent center of a GaP red-emitting device consists of zinc (Zn)-oxygen (O) pairs and light is emitted from the p-region of the GaP layer. To elevate the light emitting efficiency of the GaP device, it is necessary first to introduce a large amount of electrons into the p-region, secondly to increase the concentration of Zn-O pairs in the p-region and thirdly to reduce the formation of nonradiative recombination center. The prior art GaP device capable of emitting red light with a relatively high efficiency was manufactured by the liquid phase epitaxial growth process, so set forth, for example, in "Applied Physics Letters", Vol. 15, No. 7, Oct. 1, 1969, p. 229 – 231. The manufacturing method according to this literature consisted in epitaxially growing an n-type liquid-phase epitaxial layer on an n-type solution-grown (SG) substrate and further forming a p-type liquid-phase epitaxial layer on said n-type layer, thereby providing a p-n junction contributing to emission of light.

To effect the introduction of a large amount of electrons into the p-region, the customary practice was to increase the donor concentration $N_d$ of that part of the n-type layer which was disposed near the p-n junction over the acceptor concentration $N_a$ of the p-type layer, namely, over $1 \times 10^{18}$ cm$^{-3}$. Further, it was necessary to dope the p-type layer with a large amount of oxygen atoms in order to increase the number of Zn-O pairs in the p-region.

Since, however, oxygen is very little soluble in gallium phosphide under the condition of thermal equilibrium, an epitaxial solution has hitherto been cooled at as high a rate as 10° to 20° C/min for preparation of p-type gallium phosphide layer.

It is also known that heat treatment of a gallium phosphide wafer after formation of a p-n junction increases the number of stable Zn-O pairs and elevates the light-emitting efficiency of the gallium phosphide wafer.

It is accordingly the object of this invention to manufacture a very efficient gallium phosphide red-emitting device with good reproducibility.

This invention provides a method of manufacturing a gallium phosphide red-emitting device by forming at least one n-type gallium phosphide layer by liquid phase epitaxial growth on an n-type gallium phosphide substrate and thereafter depositing a p-type gallium phosphide layer on said n-type layer similarly by liquid phase epitaxial growth, thereby providing a p-n junction contributing to emission of light, which is characterized in that the donor concentration at the surface of the n-type gallium phosphide layer is set at a smaller level than $1 \times 10^{18}$ cm$^{-3}$; and at least the light-emitting region of the p-type gallium phosphide layer is epitaxially grown by cooling a solution for epitaxial growth of said p-type layer at a slower rate than 5° C/min. It has also been confirmed that heat treatment of the above-mentioned gallium phosphide wafer at 450° to 600° C after formation of the p-n junction enables the increase of the light emitting efficiency attained between before and after said heat treatment to be for larger than that effected between before and after said heat treatment with respect to the prior art gallium phosphide device.

Figure 2A:
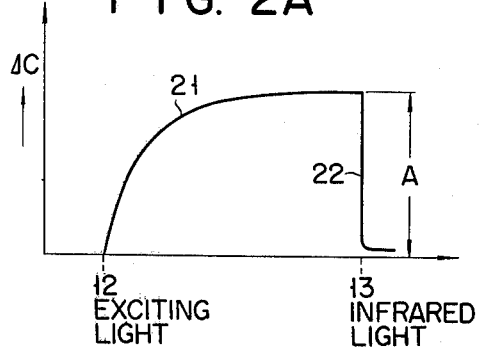
Figure 2B:
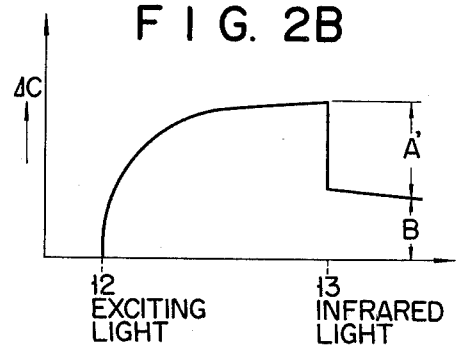
Figure 3:
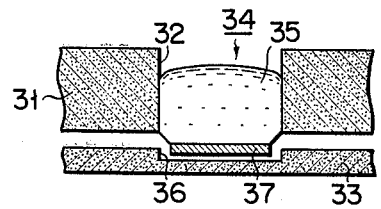
Figure 4:
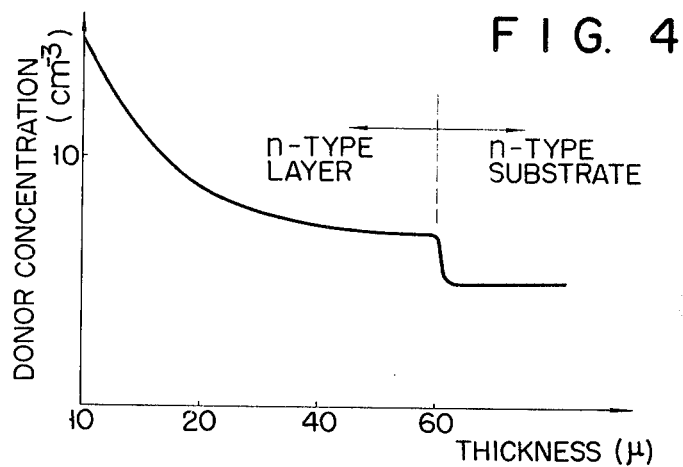
Figure 5:
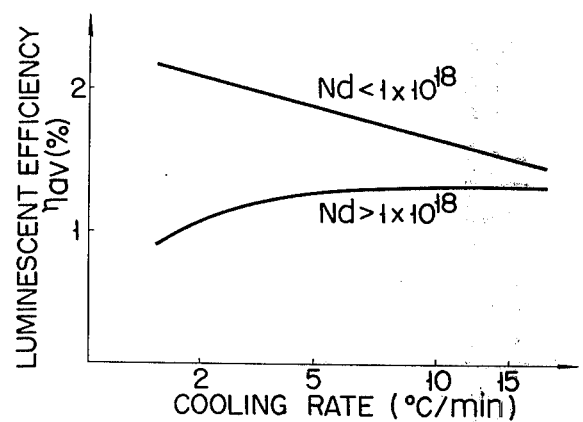
Figure 6:
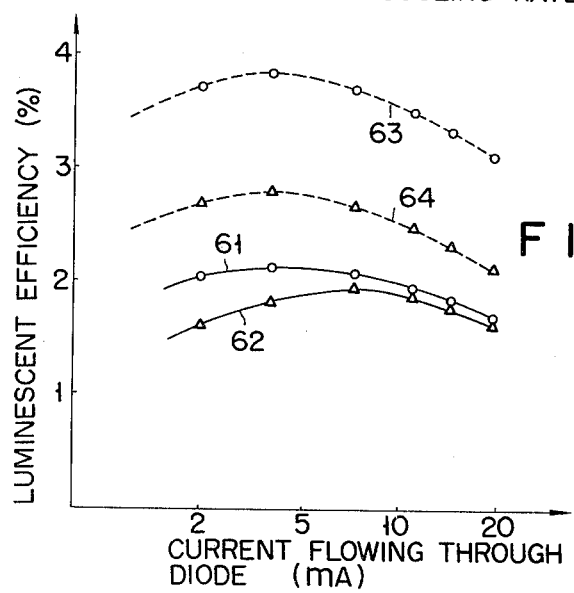

This invention can be more fully understood from the following detailed description when taken in conjunction with the accompanying drawings, in which:

FIGS. 1, 2a and 2b explain the principle by which the concentration of oxygen near the p-n junction of a gallium phosphide red-emitting device is quantitatively determined by the photocapacitance method: FIG. 1 is a band model and FIGS. 2a and 2b show variations in capacitance;

FIG. 3 schematically illustrates a slide type apparatus for epitaxially growing liquid-phase epitaxial layers on gallium phosphide substrate;

FIG. 4 indicates the distribution of donor concentration in an n-type gallium phosphide layer epitaxially grown on an n-type gallium phosphide substrate;

FIG. 5 shows the relationship of the cooling rate of p-type epitaxial layer and luminescent efficiency; and FIG. 6 presents the relationship of the amount of current running through a gallium phosphide diode and the corresponding light-emitting efficiency.

This invention originates with the undermentioned studies. Recently, a quantitative analytical method has been established to determine the concentration of oxygen near the p-n junction of a gallium phosphide red-emitting device by the photocapacitance method, as set forth in "Applied Physics Letters", Vol. 21, 1972, p. 251. There will now be briefly described said quantitative analytic method. With a gallium phosphide red-emitting device, the donor concentration $N_d$ of an n-type gallium phosphide layer and the acceptor concentration $N_a$ of a p-type gallium phosphide layer generally have a relationship of $N_d > N_a$. When, therefore, the gallium phosphide device is backward biased, the p-n junction is broadened toward the p-region. Since said n-region is free from oxygen, the condition of FIG. 1 results. The oxygen donor 11 in the p-n junction is initially positively charged. When, however, the gallium phosphide device is supplied with an exciting light 12 having a wave length of, for example, 0.8 micron, then electrons are transferred from the valence band to the oxygen donor 11 to render it neutral. Thus the capacitance C of the p-n junction gradually increases with the supply of the exciting light 12 as shown by 21 in FIG. 2a up to a fixed value, the finally increased capacitance $\Delta C$ being indicated by A in FIG. 2a. Where, under such condition, an infrared light 13 having a wave length of, for example, 1.2 microns is projected on the gallium phosphide device, then the electrons arrested by the oxygen donor 11 are further excited to a conduction band, causing the oxygen donor 11 to regain the original positively charged state. Accordingly, the capacitance of the p-n junction sharply falls as shown by 22 in FIG. 2a with the supply of the infrared light 13 to return to the initial level. Thus capacitance of the p-n junction varies with the concentration of the oxygen donor 11, making it possible to determine said concentration from the variation A of the capacitance of the p-n junction.

However, it has been disclosed that where the above-mentioned method of quantitatively analyzing oxygen is applied to gallium phosphide red-emitting devices prepared under different conditions, said method does not always present such a variation of p-n junction capacitance as indicated by A in FIG. 2a, but generally gives rise to such a charge in said capacitance as shown in FIG. 2b. Namely, where the infrared light 13 is projected on a gallium phosphide device, the p-n junction capacitance is not brought back to the original level, but, the section B of FIG. 2b still remains. It has been confirmed from the determination of the spectral distribution and attenuation time that the section A' is obviously a signal resulting from the presence of oxygen. The section B has its spectrum very broadly distributed and is excited at a slow rate and varies in magnitude with the condition in which the p-n junction is formed. This fact substantially proves that the section B is a nonradiative recombination center. Further, it has been ascertained from the various conditions in which the p-n junction is formed and the determination of the corresponding photocapacitance that a gallium phosphide in which the section A' occupies a large area and the section B a small area very efficiently emits light.

Comparison was made by the aforesaid quantitative analytical method between a solution for epitaxial growth of a p-type gallium phosphide layer which was cooled at a quick rate of 10° C/ min and a similar solution which was cooled at a slow rate of 2° to 5° C/min. It was found that with the former solution, the signal A' caused by the presence of oxygen was slightly larger and the signal B resulting from the presence of a nonradiative recombination center was far larger than in the latter solution and that the latter solution indicated a very small signal B.

Similar comparison was made between a gallium phosphide device whose n-type layer had a surface donor concentration $N_d$ of $1 \times 10^{18}$ cm$^{-3}$ and a gallium phosphide device whose n-type layer had a surface donor concentration $N_d$ of 7 to $8 \times 10^{17}$ cm$^{-3}$, showing that the former device indicated a noticeable signal B due to the presence of a nonradiative recombination center.

Where, therefore, n- and p-type gallium phosphide layers are epitaxially grown on an n-type gallium phosphide substrate to provide a p-n junction contributing to emission of light, it can be expected to obtain a very luminescent gallium phosphide device by reducing the donor concentration at the surface of the n-type gallium phosphide layer and cooling a solution for epitaxial growth of a p-type gallium phosphide layer at a slow rate.

This invention will be now fully understood from the examples which follow.

EXAMPLE 1

FIG. 3 is a fractional cross sectional view of a slide type apparatus for forming n- and p-type gallium phosphide layers on an n-type gallium phosphide substrate by liquid-phase epitaxial growth. Referential numeral 31 denotes the carbon body of said apparatus. The body 31 is bored with a vertical hole 32. A horizontally slidable carbon bottom plate 33 is disposed in close proximity to the underside of the body 31. Thus the hole 32 has its lower side closed by the bottom plate 33. A chamber 34 open at the top is defined in the body 31 by the hole 32 and bottom plate 33. Received in the chamber 34 is a solution 35 for epitaxial growth of gallium phosphide containing an n- or p-type impurity. A circular recess 36 is formed in that port of the upper surface of the bottom plate 33 which faces the aforesaid hole 32 with a diameter substantially equal to that of said hole 32. An n-type substrate 37 is held in the recess 36. Where the bottom plate 33 is made to slide horizontally so as to bring the recess 36 of the bottom plate 33 right under the hollow 32, then the upper surface of the n-type substrate 37 contacts the solution 35 for epitaxial growth of gallium phosphide.

There will now be described a method of manufacturing a gallium phosphide red-emitting diode using the slide type apparatus constructed as described above. A single crystal of Te-doped gallium phosphide with a donor concentration of $3 \times 10^{17}$ cm$^{-3}$ was prepared. A 300 micron thick substrate cut out from said single crystal was etched 10 microns with aqua regia. The substrate 37 thus prepared was fixed in the recess 36 with the (111)P plane turned upside. An epitaxial solution 35 was prepared from 40g of gallium, 4g of gallium phosphide and 9 mg of tellurium. The substrate 37 was brought into contact with the solution 35 heated to 1050° C. The solution 35 was cooled at the rate of 2° C/min to grow an n-type layer on the substrate 37 to a thickness of 70 microns. The donor concentration in the n-type layer epitaxially grown on the substrate 37 had a distribution shown in FIG. 4. This distribution was determined by evaporating a gold (Au) electrode on the ground surface of a wafer consisting of said n-type layer and substrate 37 to form a Schottky barrier and measuring the capacitance of said barrier.

The upper surface of the n-type epitaxially grown layer was etched 20 microns with aqua regia to reduce the donor concentration in said upper surface to below $1 \times 10^{18}$ cm$^{-3}$. Thereafter a p-type layer 70 microns thick was deposited on the n-type layer from a solution consisting of 40g of gallium, 4g of gallium phosphide, 10 mg of zinc (An) and 50 mg of gallium oxide ($Ga_2O_3$), by heating the solution to 1050° C and cooling it at the rate of 2° C.min while keeping it in contact with the aforesaid n-type layer. The acceptor C/min concentration of that portion of the p-type layer which was positioned near the p-n junction was $7 \times 10^{17}$ cm$^{-3}$.

Ten cubic chips each side measuring 0.9 mm were cut out of the wafer whose p-n junction was formed in the aforesaid manner. Each chip was fitted with an electrode and mounted on a TO-18 header to form a diode. The light emitting efficiency h of the diode was determined to be 2.3% on the average, 2.5% at maximum and 2.0% at minimum.

Further, determination was made of the light emitting efficiency n(%) of different types of gallium phosphide diodes prepared by varying the cooling rate (° C/min) of a solution for epitaxial growth of the p-type layer and the donor concentration $N_d$ (cm$^{-3}$) at the surface of the n-type layer, the results of both groups of determinations of the light emitting efficiency of the sample diodes being presented in Table 1 below.

Table 1

| Determination of light emitting efficiency Cooling rate (°C/min) | | | | |
|---|---|---|---|---|
| Donor concentration $N_d$ (cm$^{-3}$) | 2 | 5 | 10 | 15 |
| Lower than $1 \times 10^{18}$ | 2.5 | 2.5 | 2.0 | 2.0 |
|  | 2.3 | 2.1 | 1.8 | 1.5 |
|  | 2.0 | 1.8 | 1.0 | 0.2 |
| Higher than $1 \times 10^{18}$ | 2.0 | 2.2 | 2.2 | 2.2 |
|  | 1.0 | 1.2 | 1.4 | 1.4 |
|  | 0.2 | 0.5 | 1.0 | 1.0 |

The upper, middle and lower numbers given in each column denote maximum, average and minimum levels of light emitting efficiency respectively.

FIG. 5 collectively indicates the relationship of the average light emitting efficiency $n_{av}$ (%) and the rate of cooling a solution for epitaxial growth of the p-type layer constituting different gallium phosphide diodes from those given in Table 1 above, with the donor concentration $N_d$ (cm$^{-3}$) at the surface of the n-type layer taken as a parameter.

The experimental data given above clearly show that the luminescent efficiency of a gallium phosphide red-emitting diode is prominently elevated and is little subject to variation by keeping the donor concentration at the surface of an n-type layer at a lower level than $1 \times 10^{18}$ cm$^{-3}$ and cooling a solution for epitaxial growth of a p-type layer on said n-type layer at a slower rate than 5° C/min.

The low light emitting efficiency of a gallium phosphide diode whose n-type layer has a higher surface donor concentration than $1 \times 10^{18}$ cm$^{-3}$ is supposed to originate with the fact that the disturbed crystallinity of the n-type layer gives rise to a large number of nonradiative recombination centers. The same consideration also applies to the rate of cooling a solution for epitaxial growth of a p-type layer. Namely, a gallium phosphide diode prepared by cooling said solution at a slower rate than 5° C/min enables the p-type layer to have good crystallinity and be substantially free from the formation of nonradiative recombination centers. In contrast, with a gallium phosphide diode prepared by cooling said solution at a quicker rate than 5° C/min, the p-type layer has its crystals grown more quickly and becomes all the more defective, causing the light emitting efficiency of said diode to vary prominently from place to place.

EXAMPLE 2

An n-type layer doped with tellurium (Te) was deposited by liquid-phase epitaxial growth on an n-type substrate of single crystal gallium phosphide prepared by the liquid-encapsulated Czochralski method. The surface of the epitaxially grown n-type layer was lapped of about 20 microns. A Schottky barrier was formed on the exposed surface of the n-type layer to measure its capacitance. The donor concentration at the surface of the n-type layer was determined from said capacitance to be $8 \times 10^{17}$ cm$^{-3}$. The substrate on which the aforesaid n-type layer was grown was divided into two parts. Formed on each part is a p-type layer doped with zinc (Zn) and oxygen (O) to provide a p-n junction. The p-type (lot (a)) on one part of the substrate was prepared by cooling an epitaxial solution at the rate of 2° C/min, and the type p-type layer (lot (b)) on the other part of the substrate was grown by cooling said solution at the rate of 15° C/min. A plurality of cubic chips each side measuring 0.9 mm were cut out from both wafers thus formed. An indium (In) dot was alloyed to the n-type substrate side and an indium (In)-zinc (Zn) dot was alloyed to the p-type side so as to provide an ohmic electrode. Each chip fitted with said ohmic electrode was mounted on a transistor header to form a gallium phosphide red-emitting diode.

When supplied with current of 5mA, the diodes of lot (a) indicated a red light-emitting efficiency of 2.2% and the diodes of lot (b) indicated that of 1.9%, namely, did not present any wide difference in luminescence. The dependencies on current of the light-emitting efficiency of said lots (a) and (b) are indicated by a curve 61 (lot (a)) and a curve 62 (lot (b)). Where determination was made of the photocapacitance of said lots (a) and (b), a signal (A' in FIG. 2b) caused by the presence of oxygen had as large a value as 0.1 pF in the lot (b) and a signal (B in FIG. 2b) resulting from the presence of a nonradiative recombination center also had as noticeable a value as 0.06 pF. In contrast, the lot (a) was characterized in that a signal representing the presence of oxygen had a value of 0.08 pF, namely, slightly smaller than in the lot (b), and a signal given forth due to the presence of a nonradiative recombination center had as extremely small a value as 0.006 pF. This means that the slower the rate of cooling a solution for epitaxial growth of a p-type layer, the less prominent the lattice defects appearing in the proximity to the p-n junction. Therefore, it will be understood from this fact that in FIG. 6 the lot (a) indicates a higher light emitting efficiency than the lot (b) at the spot where small current passes.

There will now be described the case where the raw wafer of the lots (a) and (b) was heat treated 5 hours in gallium maintained at 500° C. A plurality of cubic chips were cut out of the heat treated wafer and fitted with an ohmic electrode as previously described to form red light-emitting diodes. The luminescence of the lots (a) and (b) of diodes was determined, the results being indicated by a curve 63 (lot (a)) and curve 64 (lot (b)) in FIG. 6. As viewed from the point of 10 mA, the above-mentioned heat treatment caused the lot (a) to indicate a light emitting efficiency of 3.4%, attaining as high an increase as 55%. In contrast, the lot (b), after said heat treatment, showed a light emitting efficiency of 2.5%, only realizing an increase of 32%.

EXAMPLE 3

The lots (c) and (d) of gallium phosphide diodes were prepared under substantially the same conditions as in Example 2, excepting that a solution for epitaxial growth of a p-type layer was cooled at the rate of 10° and 5° C/min. The lots (c) and (d) were further heat treated 5 hours at 500 ° C. Determination was made of the light emitting efficiency of said lots (c) and (d) before and after the heat treatment when current of 10 mA was introduced, as well as of increases in the light emitting efficiency due to the heat treatment, the results being presented in Table 2 below.

Table 2

| Cooling rate (°C/min) | Light emitting efficiency before heat treatment (%) | Light emitting efficiency after heat treatment (%) | Increase in light emitting efficiency (%) |
| --- | --- | --- | --- |
| 10 | 1.9 | 2.5 | 32 |
| 5 | 2.0 | 3.0 | 50 |

As seen from Examples 2 and 3, where a solution for epitaxial growth of a p-type layer was cooled at a slower rate than 5° C/min, the subsequent heat treatment caused the resultant gallium phosphide diode to have its light emitting efficiency prominently increased up to a higher level than 3%.

EXAMPLE 4

Six lots of gallium phosphide red-emitting diodes were prepared under the same conditions as in Example 2, excepting that different amounts of tellurium (Te) were used as an n-type impurity when said layer was epitaxially grown in liquid phase on an n-type substrate; the donor concentration at the surface of the n-type layer was also varied; and a solution for epitaxial growth of a p-type layer was cooled at the rate of 2° C/min throughout the six lots. Determination was made of the light emitting efficiency of these lots before and after a heat treatment of 5 hours at 500° C, as well as of increases in the light emitting efficiency due to said heat treatment, the results being presented in Table 3 below.

Table 3

| Donor concentration at the surface of an n-type layer ($cm^{-3}$) | Light emitting efficiency before heat treatment (%) | Light emitting efficiency after heat treatment (%) | Increase in light emitting efficiency (%) |
| --- | --- | --- | --- |
| $5 \times 10^{17}$ | 2.1 | 3.2 | 52 |
| $8 \times 10^{17}$ | 2.2 | 3.4 | 55 |
| $9.5 \times 10^{17}$ | 2.0 | 3.0 | 50 |
| $1.1 \times 10^{18}$ | 1.7 | 2.3 | 35 |
| $1.3 \times 10^{18}$ | 1.3 | 1.7 | 30 |
| $1.5 \times 10^{18}$ | 1.0 | 1.3 | 30 |

As apparent from Table 3 above, where the donor concentration $N_d$ at the surface of the n-type layer exceeded $1 \times 10^{18}$ $cm^{-3}$, the resultant gallium phosphide diode sharply fell in light emitting efficienty. Determination was also made of the photocapacitance of said six lots, showing that a signal resulting from the presence of a nonradiative recombination center became suddenly noticeable when the donor concentration increased over $1 \times 10^{18}$ $cm^{-3}$. This indicates that the crystalline perfection of the surface of the n-type layer very largely effects the growth of the p-type layer. When heat treated, those of the six lots whose n-type layer had a lower surface donor concentration than $1 \times 10^{18}$ $cm^{-3}$ had their light emitting efficiency noticeably increased up to a higher level than 3%.

The experimental data described in connection with the foregoing examples were obtained only where heat treatment was carried out 5 hours at 500° C. However, where the temperature of heat treatment was changed within the range of 450° to 600° C and the time of heat treatment was varied within the range of 2 to 20 hours, substantially the similar results were still obtained. Further, the foregoing description refers to the case where an n-type layer was first epitaxially grown in liquid phase on an n-type substrate and thereafter a p-type layer was formed on said n-type layer similarly by epitaxial growth in liquid phase, namely, a double liquid phase epitaxial growth process was applied. This is for the reason that a large n-type substrate of good crystallinity is not procurable yet. If, however, an n-type substrate of high crystallinity should be made available in the future, then it would be possible to form a p-type layer directly on said substrate by epitaxial growth in liquid phase. In such case, too, this invention would obviously be effective.

Throughout the foregoing examples, the donor impurity of an n-type gallium phosphide layer consisted of tellurium (Te). Of course, tellurium may be replaced by, for example, sulfur or selenium.

What we claim is:

1. A method of manufacturing a gallium phosphide red light emitting device comprising the steps of preparing an n-type gallium phosphide substrate; expitxally growing an n-type gallium phosphide layer in liquid phase on the substrate to impart to one surface of the layer a donor concentration of less than $1 \times 10^{18}$ $cm^{-3}$; and forming a p-type gallium phosphide layer on said surface of the n-type layer, at least the light emitting region of the p-type gallium phosphide layer formed by liquid-phase epitaxial growth, and cooling at a rate of less than 5° C/min so as to enhance the crystallinity of the p-type layer near the p-n junction.

2. A method of manufacturing a gallium phosphide red light emitting device comprising the steps of preparing an n-type gallium phosphide substrate; epitaxially growing an n-type gallium phosphide layer in liquid phase on the substrate to impart to one surface of the layer of a donor concentration of less than $1 \times 10^{18}$ $cm^{-3}$; and forming a p-type gallium phosphide layer doped with zinc and oxygen on said surface of the n-type layer, at least the light emitting region of the p-type gallium phosphide layer formed by liquid phase epitaxial growth, and cooling at a rate of less than 5° C/min, so as to form a non-irregular crystal portion in the p-type layer near said surface of the n-type layer.

3. A method of claim 2, wherein the substrate, the n-type layer, and the p-type layer are heated at a temperature of from 450° C to 600° C.

4. A method of claim 1, wherein the substrate, and the n-type layer are doped with tellurium, and the p-type layer is doped with zinc and oxygen.

* * * * *